United States Patent
Yuan

(10) Patent No.: US 7,187,313 B1
(45) Date of Patent: Mar. 6, 2007

(54) FRACTIONAL-N FREQUENCY SYNTHESIZER WITH SIGMA-DELTA MODULATOR FOR VARIABLE REFERENCE FREQUENCIES

(75) Inventor: Wei Yuan, San Diego, CA (US)

(73) Assignee: Mediatek Inc., Hsin-Chu Hsien (TW)

( * ) Notice: Subject to any disclaimer, the term of this patent is extended or adjusted under 35 U.S.C. 154(b) by 0 days.

(21) Appl. No.: 11/383,758

(22) Filed: May 17, 2006

Related U.S. Application Data

(60) Provisional application No. 60/596,948, filed on Oct. 31, 2005.

(51) Int. Cl.
   *H03M 3/00* (2006.01)
(52) U.S. Cl. .................. 341/143; 341/144
(58) Field of Classification Search ......... 341/130–172
   See application file for complete search history.

(56) References Cited

U.S. PATENT DOCUMENTS

| | | | |
|---|---|---|---|
| 4,965,531 A | 10/1990 | Riley | |
| 5,079,521 A | 1/1992 | Gaskell et al. | |
| 6,844,836 B1* | 1/2005 | Lee | 341/143 |
| 6,897,796 B2* | 5/2005 | Dias et al. | 341/143 |
| 6,927,716 B2* | 8/2005 | Keaveney et al. | 341/143 |
| 7,123,101 B2* | 10/2006 | Puma et al. | 341/143 |

* cited by examiner

*Primary Examiner*—Rexford Barnie
*Assistant Examiner*—Lam T. Mai
(74) *Attorney, Agent, or Firm*—Winston Hsu

(57) ABSTRACT

A frequency synthesizer includes: a phase detector, a loop filter, a controllable oscillator, a frequency divider, and a sigma-delta modulator for providing the division factor according to an integral part and a fractional part. The sigma-delta modulator includes a controller for providing a first digital value, a second digital value and a third digital value; a first adder for combining the second digital value, the third digital value, and a digital feedback value to generate a combination result; a quantizer for quantizing the combination result to generate a quantization value; a second adder for combining the first digital value and the quantization value to generate the division factor; and a multiplier for multiplying the quantization value by a constant multiplication factor; wherein the controller adjusts the third digital value in response to the reference signal for making an output frequency resolution substantially fixed.

8 Claims, 6 Drawing Sheets

FRACTIONAL-N FREQUENCY SYNTHESIZER WITH SIGMA-DELTA MODULATOR FOR VARIABLE REFERENCE FREQUENCIES

BACKGROUND

The present invention relates to a Fraction-N synthesizer, and more particularly, to a Fraction-N synthesizer with a sigma-delta modulator for variable reference frequencies.

In general, frequency synthesizers use a reference signal of a reference frequency as a source signal and synthesize a desired output signal having a frequency that is a multiple of the reference frequency. Please refer to FIG. 1. FIG. 1 shows a block diagram of a conventional Fractional-N frequency synthesizer 100. The frequency synthesizer 100 includes a phase detector 110, a loop filter 120, a voltage controlled oscillator (VCO) 130, a frequency divider 140, and a sigma-delta modulator (SDM) 150. The frequency divider 140 is utilized for dividing the output frequency $F_{out}$ of an output signal $S_{out}$ by a division factor (i.e. N±n) provided by the sigma-delta modulator 150, and for generating a feedback signal $S_b$. The phase detector 110 then compares phases of the feedback signal $S_b$ and the reference signal $S_{ref}$ and outputs a phase difference signal $S_e$ representing the phase difference between the feedback signal $S_b$ and the reference signal $S_{ref}$. The phase difference signal $S_e$ is filtered by means of the loop filter 120 to generate a control voltage $V_t$ for controlling the VCO 130 to generate the output signal $S_{out}$. The output frequency of the output signal $S_{out}$ is a function of the control voltage $V_t$.

In the conventional Fractional-N frequency synthesizer 100, the division factor, which is utilized for dividing the output signal $S_{out}$, is switched between two or more integer values determined by the sigma-delta modulator 150. Please refer to FIG. 2. FIG. 2 shows a block diagram of the sigma-delta modulator 150 shown in FIG. 1. The sigma-delta modulator 150 includes an integral end source 151, a fractional end source 152, adders 156 and 158, a low-pass filter 154, a quantizer 155, and a base multiplier 157. Please note that, since the component of the conventional sigma-delta modulator 150 is considered well-known in the pertinent art further details are omitted for brevity. The integral end source 151, could be a memory register, provides the integral part N and the fractional end source 152, could be a memory register, provides the fractional part FE. The low-pass filter 154 can be configured as a multiple-order low-pass filter to filter the fractional part FE. The quantizer 155 quantizes the filtered fractional part FE into a specific quantization value that lies in a range +n to −n with multiple levels. The quantization value within a range from +n to −n is then multiplied by a fixed base value B utilized by the base multiplier 157. The negative feedback is implemented to feed the computation result of the base multiplier 157 to the adder 158, where the adder 158 subtracts the computation result of the base multiplier 157 from the fractional part FE. As shown in FIG. 2, the adder 156 combines the integral part N with each obtained quantization value in a range +n to −n to generate a sequence of dividers ranging from N−n to N+n. Therefore, the long-term average generated by the sigma-delta modulator 150 is equivalent to N+FE. The relationship between the average output frequency $F_{out}$ of the output signal $S_{out}$ and the reference frequency $F_{ref}$ of the reference signal $S_{ref}$ can be expressed as follows:

$$F_{out}=F_{ref}\times(N+FE) \qquad \text{Formula (1)}$$

The base value B provided by the base multiplier 157 can be decided by the reference frequency $F_{ref}$ and the required output frequency resolution $F_{res}$ as follows:

$$B=F_{ref}/GCD(F_{ref},F_{res}) \qquad \text{Formula (2)}$$

In Formula (2), GCD represents the Greatest Common Divisor. That is, GCD ($F_{ref}$, $F_{res}$) is the greatest common divisor of $F_{ref}$ and $F_{res}$.

In the above scheme, the base value B is obtained from the reference frequency $F_{ref}$. If the reference frequency $F_{ref}$ is changed, the base value B in the base multiplier 157 also needs to be changed to a specific value. That is, the sigma-delta modulator 150 in the conventional frequency synthesizer 100 is designed to support a single fixed reference frequency $F_{ref}$. If there are requirements for variable reference frequencies, a corresponding base value needs to be calculated for each reference frequency and different feedback loop circuits may need to be designed for each reference frequency in the sigma-delta modulator 150, causing high space consumption and less efficiency. Therefore, how to design the sigma-delta modulator having a constant base value, regardless of the reference frequency in order to improve performance of the frequency synthesizer becomes an important issue in the manufacture of the frequency synthesizer.

SUMMARY

It is one of the objectives of the present invention to provide a frequency synthesizer with a Sigma-Delta modulator having a constant-base value for variable reference frequencies, to solve the above-mentioned problems.

According to an aspect of the present invention, a frequency synthesizer is disclosed. The frequency synthesizer includes a phase detector, a loop filter, a controllable oscillator, a frequency divider, and a sigma-delta modulator. The phase detector is coupled to a reference signal and a feedback signal for generating a phase difference signal representing a phase difference between the reference signal and the feedback signal; The loop filter is coupled to the phase detector for filtering the phase difference signal and generating a control voltage; The controllable oscillator is coupled to the loop filter for generating an output signal according to the control voltage; The frequency divider is coupled to the controllable oscillator and the phase detector for dividing the frequency of the output signal according to a division factor to generate the feedback signal. The sigma-delta modulator is coupled to the frequency divider for providing the division factor according to an integral part and a fractional part. The sigma-delta modulator includes a controller, a first and second adder, a low-pass filter, a quantizer, and a multiplier. The controller provides a first digital value, a second digital value and a third digital value, wherein the first digital value represents the integral part, the second digital value represents a first portion of the fractional part, and the third digital value represents a second portion of the fractional part; The first adder is coupled to the controller for combining the second digital value, the third digital value, and a digital feedback value to generate a combination result; The low-pass filter is coupled to the first adder for outputting a filtering result according to the combination result; The quantizer is coupled to the low-pass filter for quantizing the filtering result to generate a quantization value; The second adder is coupled to the quantizer for combining the first digital value and the quantization value to generate the division factor. The multiplier is coupled to the first adder and the quantizer for multiplying the quantization value by a constant multiplication factor. The controller adjusts the third digital value in response to the reference signal for making an output frequency resolution substantially fixed.

According to another aspect of the present invention, a method for frequency synthesizing is disclosed. The frequency synthesizing method comprises: generating a control voltage according to a phase difference between a reference signal and a feedback signal; generating an output signal according to the control voltage; dividing the frequency of the output signal according a division factor to generate the feedback signal; and providing the division factor according to an integral part and a fractional part. The step of providing the division factor according to an integral part and a fractional part is by providing a first digital value, a second digital value and a third digital value, wherein the first digital value represents the integral part, the second digital value represents a first portion of the fractional part, and the third digital value represents a second portion of the fractional part; combining the second digital value, the third digital value, and a digital feedback value to generate a combination result; filtering the combination result for outputting a filtering result; quantizing the filtering result to generate a quantization value; combining the first digital value and the quantization value to generate the division factor; multiplying the quantization value by a constant multiplication factor; and adjusting the third digital value in response to the reference signal for making an output frequency resolution substantially fixed.

In contrast to the related art sigma-delta modulator, the sigma-delta modulator of the present invention having a base multiplier with a constant base value B, can support the Fractional-N frequency synthesizer with variable reference frequencies. The sigma-delta modulator of the present invention estimates a fractional part FE, a fractional remainder part FER, and an integral part N according to the output frequency $F_{out}$, the reference frequency $F_{ref}$, and the base value B, providing the frequency synthesizer with a more flexible and efficient function regardless of the inputted reference frequencies.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
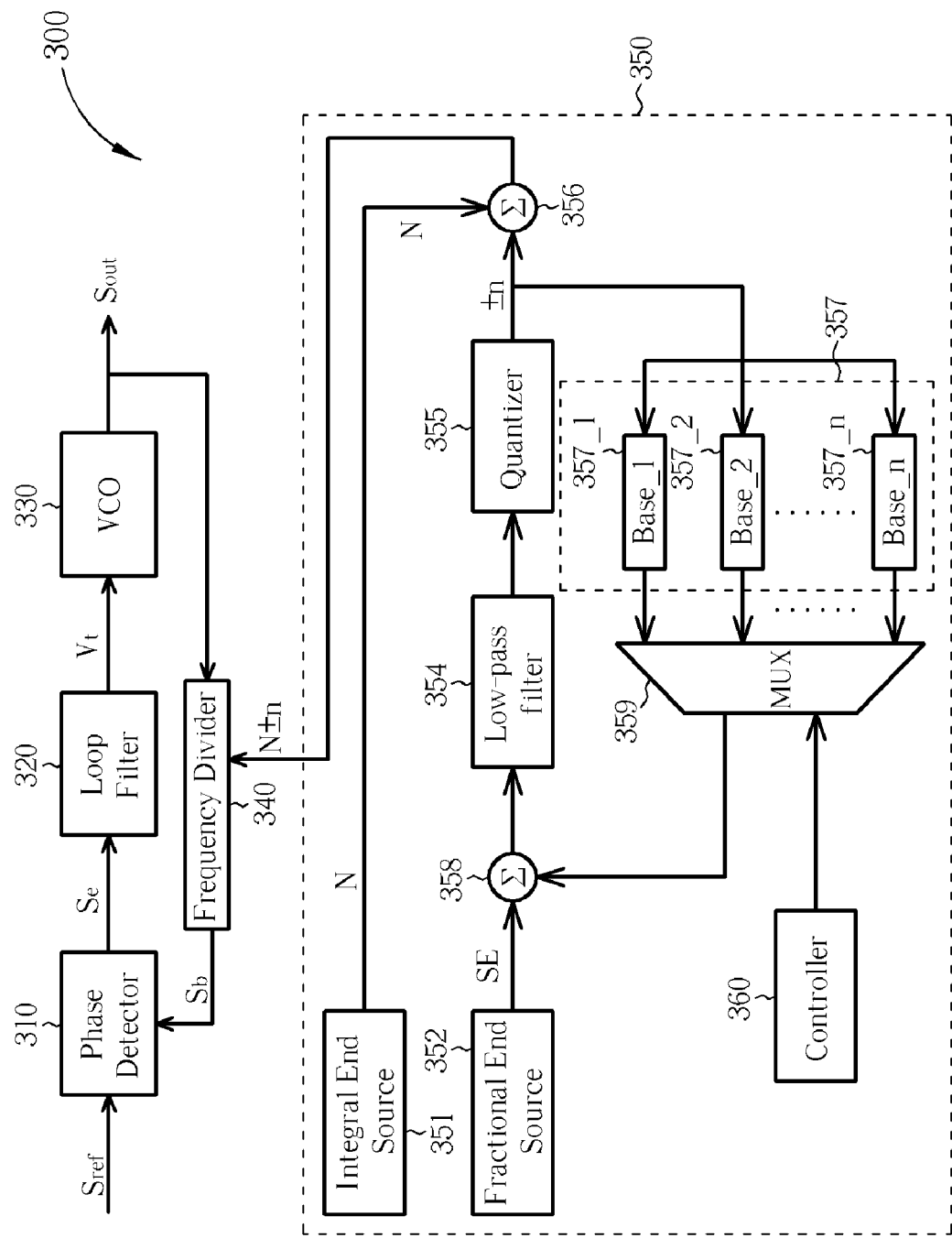
FIG. 3 shows a block diagram of a Fractional-N frequency synthesizer according to a first embodiment of the present invention.

Please refer to FIG. 3. FIG. 3 shows a block diagram of a Fractional-N frequency synthesizer 300 according to a first embodiment of the present invention. The frequency synthesizer 300 includes a phase detector 310, a loop filter 320, a voltage controlled oscillator (VCO) 330, a frequency divider 340, and a sigma-delta modulator 350. As shown in FIG. 3, the basic architecture of the frequency synthesizer 300 is similar to the conventional design detailed earlier. The frequency divider 340 is utilized for dividing the output frequency $F_{out}$ of the output signal $S_{out}$ with a division factor provided by the sigma-delta modulator 350, and for generating a feedback signal $S_b$. The phase detector 310 then compares phases of the feedback signal $S_b$ and the reference signal $S_{ref}$ and outputs a phase difference signal $S_e$ representing the phase difference between the feedback signal $S_b$ and the reference signal $S_{ref}$. The phase difference signal $S_e$ is filtered by means of the loop filter 320 to generate a control voltage $V_t$ for controlling the VCO 330 to generate the output signal $S_{out}$. The output frequency of the output signal $S_{out}$ is a function of the control voltage $V_t$.

Figure 1:
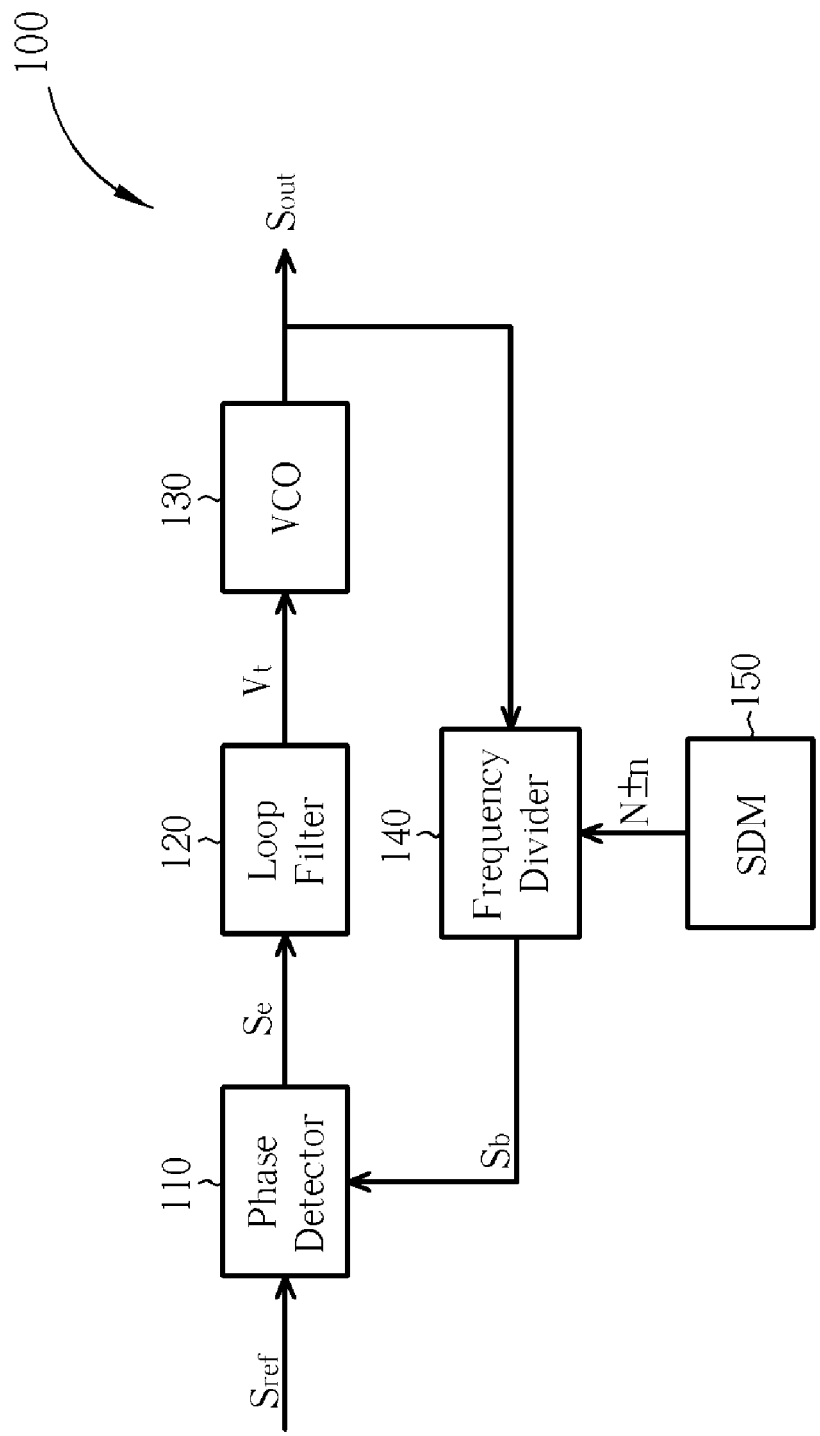
FIG. 1 shows a block diagram of a conventional Fractional-N frequency synthesizer.
Figure 2:
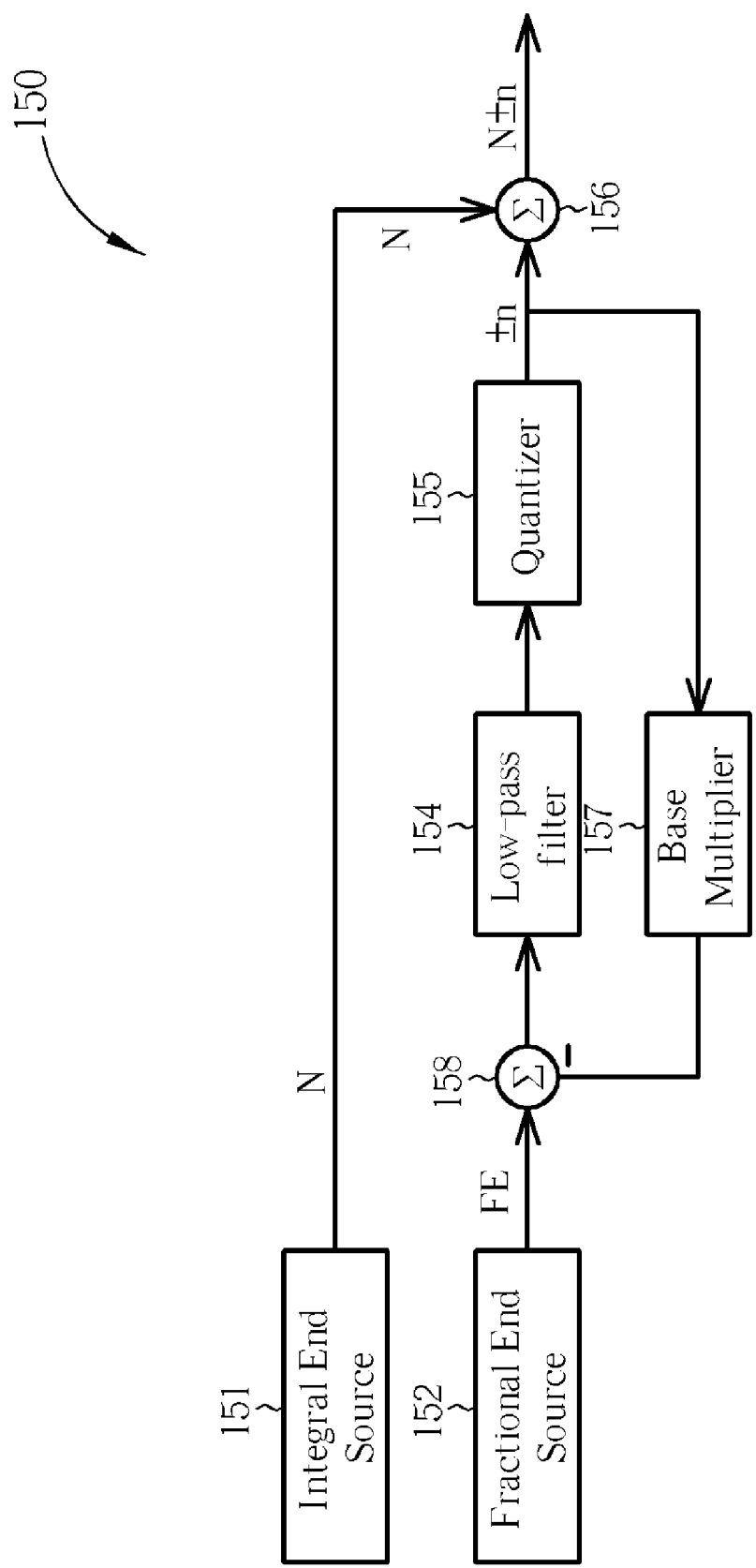
FIG. 2 shows a block diagram of the sigma-delta modulator shown in FIG. 1.

As shown in FIG. 3, the sigma-delta modulator 350 in this embodiment includes a controller 360, an integral end source 351, a fractional end source 352, adders 356 and 358, a low-pass filter 354, a quantizer 355, a base module 357, and a multiplexer (MUX) 359. Since the elements of the same name in FIG. 2 and FIG. 3 have the same function and operation, detailed description is omitted for the sake of brevity. The main difference between the sigma-delta modulator 350 in FIG. 3 and the sigma-delta modulator 150 in FIG. 2 is that the base module 357 of the sigma-delta modulator 350 includes a plurality of base modulators 357_1, 357_2, ..., 357_n which respectively correspond to different reference frequencies. The controller 360 controls the MUX 359 to select one of the base modulators according to the current input reference frequency to establish the desired feedback loop. For example, suppose there are three different reference frequencies $F_{ref1}$, $F_{ref2}$, and $F_{ref3}$ supported by the frequency synthesizer 300. That is, according to the above-mentioned Formula (2), there are three different base values B1, B2, and B3 respectively provided in the base modulator 357_1, 357_2, and 357_3. The controller 360 then controls the MUX 359 to select the corresponding base modulator according to the current reference frequency. If the reference frequency is $F_{ref1}$, the MUX 359 will select the base modulator 357_1 with the base value B1 to establish the feedback loop. In this embodiment, the frequency synthesizer 300 can be applied in the multiple reference frequencies without changing the basic architecture.

Figure 4:
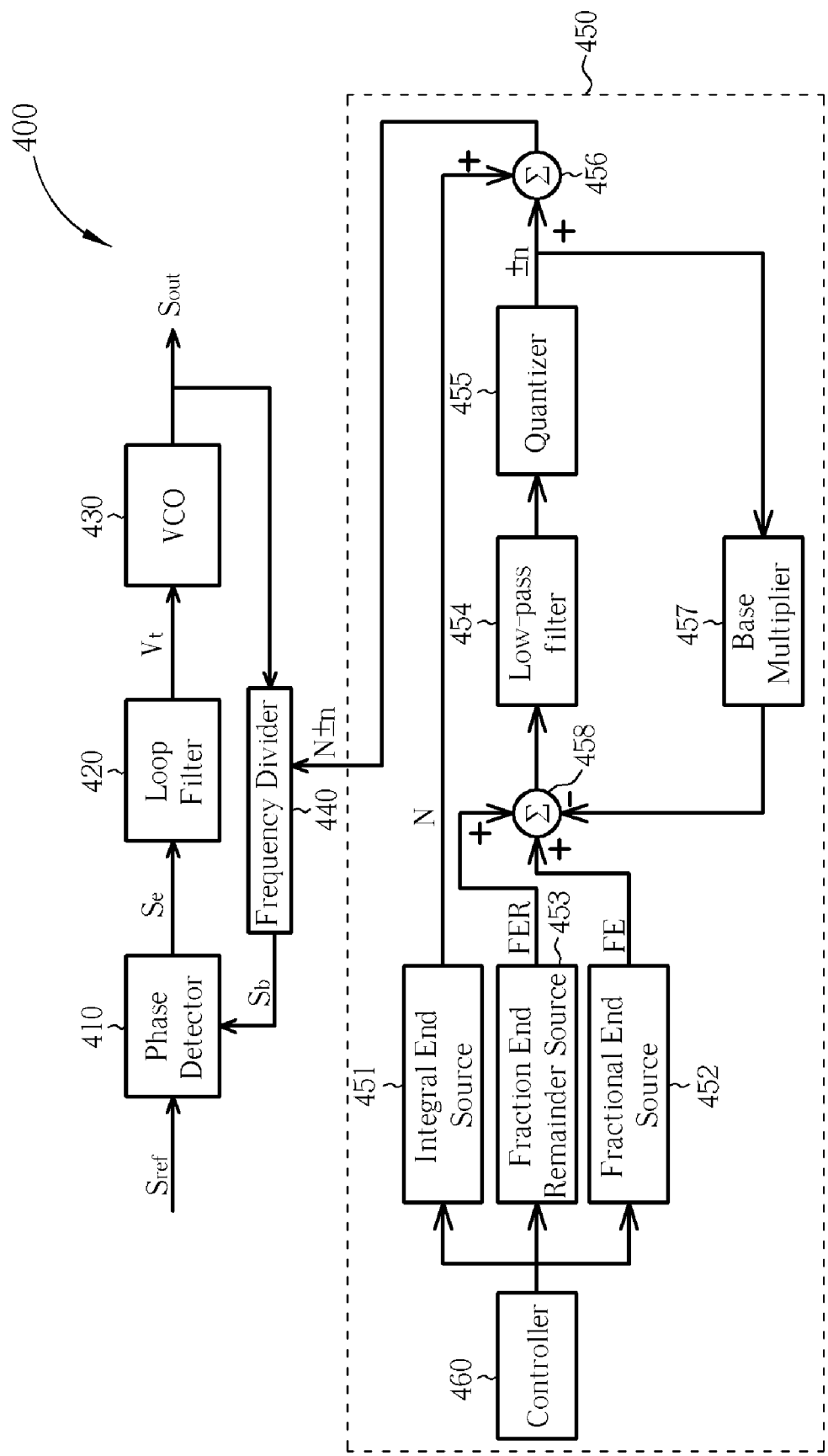
FIG. 4 shows a block diagram of a Fractional-N frequency synthesizer according to a second embodiment of the present invention.

Please refer to FIG. 4. FIG. 4 shows a block diagram of a Fractional-N frequency synthesizer 400 according to a second embodiment of the present invention. The frequency synthesizer 400 includes a phase detector 410, a loop filter 420, a voltage controlled oscillator (VCO) 430, a frequency divider 440, and a sigma-delta modulator 450. Since the elements of the same name in FIG. 4 and FIG. 3 have the same function and operation, detailed description is omitted for the sake of brevity. The main difference between the sigma-delta modulator 350 in FIG. 3 and the sigma-delta modulator 450 in FIG. 4 is the internal circuit configuration. As shown in FIG. 4, the sigma-delta modulator 450 in this embodiment includes a controller 460, an integral end source 451, a fractional end source 452, a fractional end remainder source 453, adders 456 and 458, a low-pass filter 454, a quantizer 455, and a base multiplier 457. Please note that, in this embodiment, the base multiplier 457 with single base value B is applied in the sigma-delta modulator 450 for the variable reference frequencies. That is, in general, the base value B in the base multiplier 457 may not equal the value found using the above-mentioned Formula (2). Therefore, in order to have the required output frequency resolution $F_{res}$, the fractional part FE, which is generated from the fractional end source 452 of the sigma-delta modulator 450, needs to be compensated by a sub-fractional number or a fractional remainder part FER. The relationship among the output frequency $F_{out}$, the reference frequency $F_{ref}$, the integral part N, the fractional part FE, the fractional remainder part FER and the base value B, can be formulated as follows:

$$N=F_{out}/F_{ref} \qquad \text{Formula (3)}$$

$$F_{rac}=\text{Mod}(F_{out},F_{ref}) \qquad \text{Formula (4)}$$

$$FE=(F_{rac} \times B)/F_{ref} \qquad \text{Formula (5)}$$

$$FER=\text{Mod}[(F_{rac} \times B), F_{ref}] \qquad \text{Formula (6)}$$

In Formula (4) and Formula (6), Mod represents a modulo computation. Please note that, in the above formulas (3) and (5), the divisions are all integer divisions, which means the remainder of the above-mentioned formulas will be ignored. In this embodiment, the controller 460 first calculates the integral part N according to the current reference frequency $F_{ref}$ and the output frequency $F_{out}$ by Formula (3) and sends the integral part N to the integral end source 551. Next, the controller 460 calculates the remainder $F_{rac}$ of the current reference frequency $F_{ref}$ and the output frequency $F_{out}$ according to Formula (4). After obtaining the remainder $F_{rac}$, the fractional part FE can then be calculated by the controller 460 according to Formula (5), and the fractional remainder part FER also can be calculated according to Formula (6). The controller 460 respectively sets the fractional part FE and fractional remainder part FER to the fractional end source 452 and the fractional end remainder source 453.

Next, the adder 458 combines the fractional part FE, the fractional remainder part FER, and the negative feedback result of the base multiplier 457 to the low-pass filter 454. The low-pass filter 454 can be configured as a multiple-order low-pass filter for filtering the combination result outputted from the adder 458. The quantizer 455 then quantizes the filtered combination result into a specific quantization value in a range from +n to −n with multiple levels. The base multiplier 457 then multiplies the quantization value outputted from the quantizer 455 by a constant base value B and outputs the feedback result to the adder 458. Moreover, the adder 456 combines the integral part N with each obtained quantization value in a range from +n to −n to generate a sequence of dividers within a range from N−n to N+n. Therefore, a long-term average generated by the sigma-delta modulator 450 is equal to N+FE. The average output frequency $F_{out}$ will be equal to $F_{ref} \times (N+FE)$.

Figure 5:
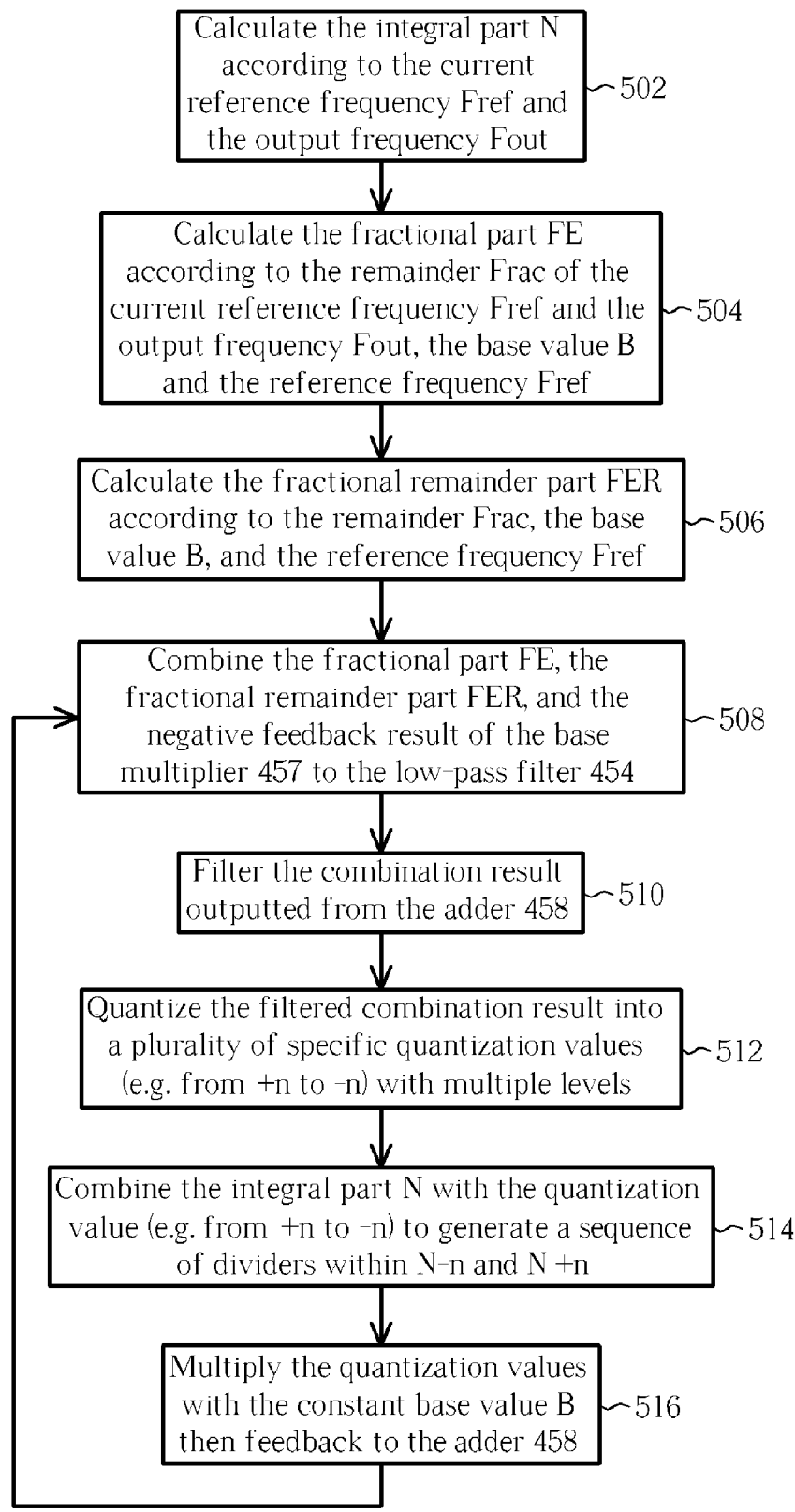
FIG. 5 shows a flowchart illustrating operation of the sigma-delta modulator shown in FIG. 4.

Please note that, in this embodiment, the Fractional-N frequency synthesizer 400 is capable of supporting variable reference frequency. That is, the controller 460 of the sigma-delta modulator 450 can generate the corresponding fractional part FE, the fractional remainder part FER, and the integral part N for the specific reference frequency according to the above-mentioned formulae. The base value B of the base multiplier 457 is fixed without concerning different reference frequencies. Please refer to FIG. 5. FIG. 5 shows a flowchart illustrating operation of the sigma-delta modulator 450 shown in FIG. 4. Please note that the related steps in the flowchart do not have to follow this shown sequence and other steps can be inserted. The operation of the sigma-delta modulator 450 is summarized as below:

Step 502: The controller 460 calculates the integral part N according to the current reference frequency $F_{ref}$ and the output frequency $F_{out}$.

Step 504: The controller 460 calculates the fractional part FE according to the remainder $F_{rac}$ of the current reference frequency $F_{ref}$ and the output frequency $F_{out}$, the base value B and the reference frequency $F_{ref}$.

Step 506: The controller 460 calculates the fractional remainder part FER according to the remainder $F_{rac}$, the base value B, and the reference frequency $F_{ref}$.

Step 508: The adder 458 combines the fractional part FE, the fractional remainder part FER, and the negative feedback result of the base multiplier 457 and then outputs a combination result to the low-pass filter 454.

Step 510: The low-pass filter 454 filters the combination result outputted from the adder 458.

Step 512: The quantizer 455 quantizes the filtered combination result into a specific quantization value in a range from +n to −n with multiple levels.

Step 514: The adder 456 combines the integral part N with each obtained quantization values to generate a sequence of dividers within N−n and N+n.

Step 516: The base multiplier 457 multiplies each quantization value with the constant base value B, and then feeds the computation result back to the adder 458.

Please note that the fractional remainder part FER in this embodiment is not limited to be obtained from Formula (6) only. Other computation rules are also possible. For example, the fractional remainder part FER can be adjusted and replaced by using the following formula to fit into a control register with R bits:

$$\text{Adjusted } FER=FER*2^R/F_{ref} \qquad \text{Formula (7)}$$

As mentioned above, the division of Formula (7) is also an integer division. That is, the remainder of the division in Formula (7) will be ignored, which could cause frequency error in the output frequency $F_{out}$. However, by choosing a large enough R, this frequency error can be limited to a very small amount. For example, in one embodiment of the sigma-delta modulator 450 designed to be applied to 802.11b/g applications, if the reference frequency $F_{ref}$ is 19.2 Mhz, the constant base value B is 32, and the R is 14, from the experimental result of this example, the frequency error of the output frequency $F_{out}$ is less than 0.0051 P.P.M, and is therefore small enough to be ignored safely. Moreover, the base value B of the base multiplier 457 can be set in variable ways and is not limited to the above disclosure. For the implementation convenience, the base value B can be set as an integer 2 to a power n, so the base multiplier 457 can be implemented by a shift register.

Figure 6:
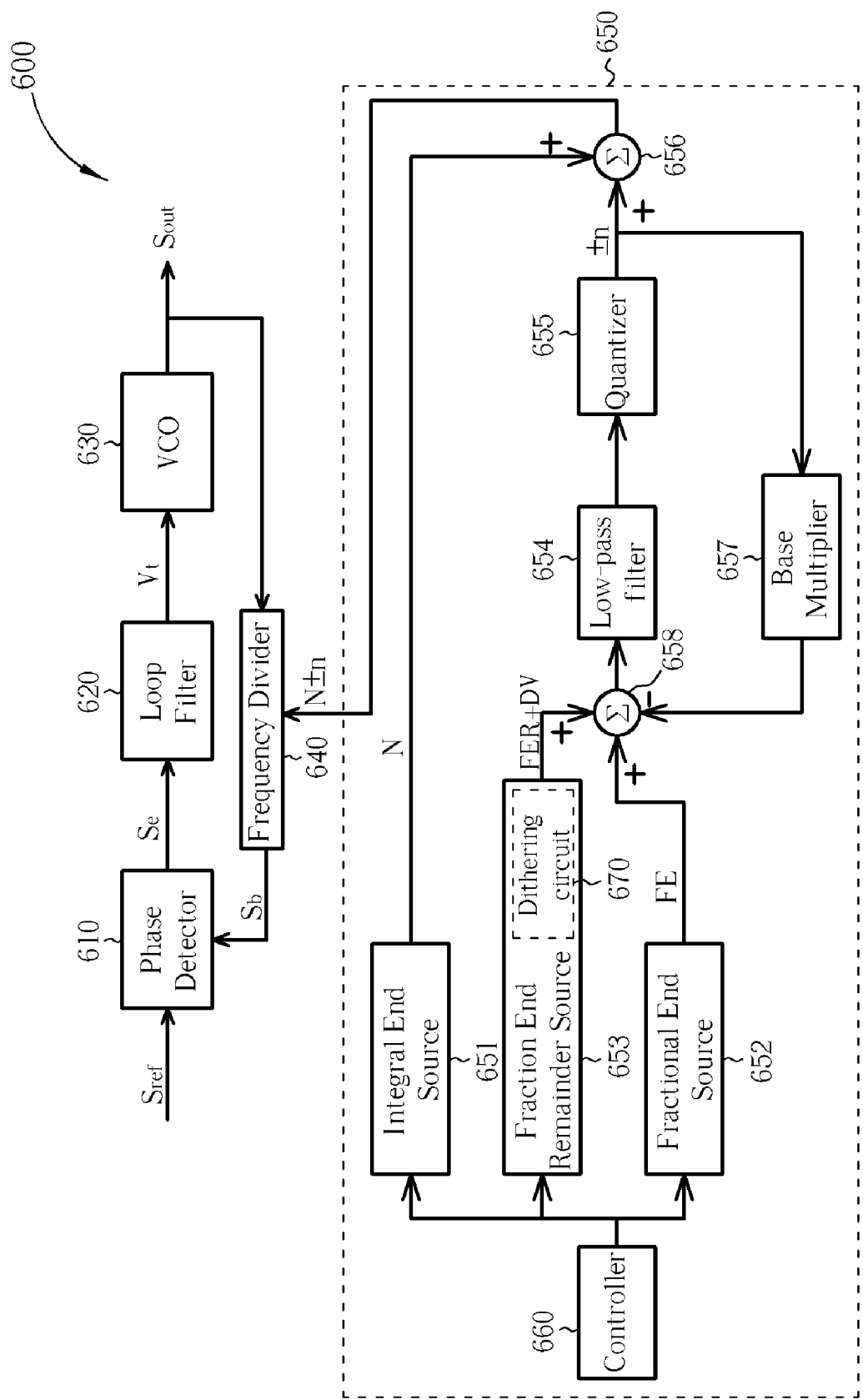
FIG. 6 shows a block diagram of a Fractional-N frequency synthesizer according to a third embodiment of the present invention.

Please note that in other embodiments, the fractional remainder part FER can also be piggybacked onto a dithering circuit adopted by the sigma-delta modulator for conserving memory space. Please refer to FIG. 6. FIG. 6 shows a block diagram of a Fractional-N frequency synthesizer 600 according to a third embodiment of the present invention. The frequency synthesizer 600 includes a phase detector 610, a loop filter 620, a voltage controlled oscillator (VCO) 630, a frequency divider 640, and a sigma-delta modulator 650. Since the elements of the same name in FIG. 6 and FIG. 4 have the same function and operation, detailed description is omitted for the sake of brevity. The main difference between the sigma-delta modulator 450 in FIG. 4 and the sigma-delta modulator 650 in FIG. 6 is the internal circuit configuration. The sigma-delta modulator 650 in this embodiment includes a controller 660, adders 656 and 658, a low-pass filter 654, a quantizer 655, a base multiplier 657 and a dithering circuit 670. In general, a dithering circuit can be implemented in a sigma-delta modulator to suppress undesired noise interference. As shown in FIG. 6, the dithering circuit 670 is for providing a dithering output to the following adder 658. In this embodiment, after calculating the fractional remainder part FER, the controller 660 outputs the fractional remainder part FER to the dithering circuit 670. The dithering circuit 670 is originally designed to provide a dithering value DV, which is an extremely small value and is adjustable. Therefore, the fractional remainder part FER is piggybacked onto the original dithering value DV. That is, the dithering circuit 670 combines the fractional remainder part FER with the dithering value DV (i.e., FER+DV) to provide the dithering output sent to the adder 658. In this situation, the fractional end remainder source 653 of the sigma-delta modulator 750 costs no extra memory space to store the fractional remainder FER compared with the conventional sigma-delta modulator.

In contrast to the related art sigma-delta modulator, the sigma-delta modulator in the present invention having a base multiplier with a constant base value B, can support the Fractional-N frequency synthesizer with variable reference frequencies. The sigma-delta modulator in the present invention estimates a fractional part FE, a fractional remainder part FER, and an integral part N according to the output frequency $F_{out}$, the reference frequency $F_{ref}$, and the base value B, which provides the frequency synthesizer with a more flexible and efficient function regardless of the reference frequency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency synthesizer, comprising:
   a phase detector, coupled to a reference signal and a feedback signal, for generating a phase difference signal representing a phase difference between the reference signal and the feedback signal;
   a loop filter, coupled to the phase detector, for filtering the phase difference signal and generating a control voltage;
   a controllable oscillator, coupled to the loop filter, for generating an output signal according to the control voltage;
   a frequency divider, coupled to the controllable oscillator and the phase detector, for dividing the frequency of the output signal according to a division factor to generate the feedback signal; and
   a sigma-delta modulator, coupled to the frequency divider, for providing the division factor according to an integral part and a fractional part, the sigma-delta modulator comprising:
      a controller for providing a first digital value, a second digital value and a third digital value, wherein the first digital value represents the integral part, the second digital value represents a first portion of the fractional part, and the third digital value represents a second portion of the fractional part;
      a first adder, coupled to the controller, for combining the second digital value, the third digital value, and a digital feedback value to generate a combination result;
      a low-pass filter, coupled to the first adder, for outputting a filtering result according to the combination result;
      a quantizer, coupled to the low-pass filter, for quantizing the filtering result to generate a quantization value;
      a second adder, coupled to the quantizer, for combining the first digital value and the quantization value to generate the division factor; and
      a multiplier, coupled to the first adder and the quantizer, for multiplying the quantization value by a constant multiplication factor;
   wherein the controller adjusts the third digital value in response to the reference signal for making an output frequency resolution substantially fixed.

2. The frequency synthesizer of claim 1, wherein the controller determines the first digital value N, the second digital value FE, and the third digital value FER by the following equations:

$N=F_{out}/F_{ref}$;

$FE=\{[Mod(F_{out},F_{ref})] \times CB\}/F_{ref}$; and $FER=Mod\{\{[Mod(F_{out},F_{ref})] \times CB\},F_{ref}\}$;

where $F_{out}$ represents the frequency of the output signal, $F_{ref}$ represents the frequency of the reference signal, CB represents the constant multiplication factor, and Mod{ } represents a modulo operation.

3. The frequency synthesizer of claim 1, wherein the controller determines the first digital value N, the second digital value FE, and the third digital value FER by the following equations:

$N=F_{out}/F_{ref}$;

$FE=\{[Mod(F_{out},F_{ref})] \times CB\}/F_{ref}$; and $FER=\{Mod\{\{[Mod(F_{out},F_{ref})] \times CB\},F_{ref}\}\} * 2^R/F_{ref}$;

where $F_{out}$ represents the frequency of the output signal, $F_{ref}$ represents the frequency of the reference signal, CB represents the constant multiplication factor, R is an integer, and Mod{ } represents a modulo operation.

4. The frequency synthesizer of claim 1, wherein the sigma-delta modulator further comprises a dithering circuit, coupled to the controller, for receiving the third digital value and generating a dithering value according to the received third digital value; and the first adder combines the dithering value, the second digital value, and the digital feedback value to generate the combination result.

5. A frequency synthesizing method, comprising:
   generating a control voltage according to a phase difference between a reference signal and a feedback signal;
   generating an output signal according to the control voltage;
   dividing the frequency of the output signal according to a division factor to generate the feedback signal; and
   providing the division factor according to an integral part and a fractional part by:
      providing a first digital value, a second digital value and a third digital value, wherein the first digital value represents the integral part, the second digital value represents a first portion of the fractional part, and the third digital value represents a second portion of the fractional part;
      combining the second digital value, the third digital value, and a digital feedback value to generate a combination result;

filtering the combination result for outputting a filtering result;

quantizing the filtering result to generate a quantization value;

combining the first digital value and the quantization value to generate the division factor;

multiplying the quantization value by a constant multiplication factor; and adjusting the third digital value in response to the reference signal for making an output frequency resolution substantially fixed.

6. The frequency synthesizing method of claim 5, wherein the step of providing the first digital value, the second digital value and the third digital value comprises:

determining the first digital value N, the second digital value FE, and the third digital value FER by the following equations:

$$N = F_{out}/F_{ref};$$

$$FE = \{[\mathrm{Mod}(F_{out}, F_{ref})]*CB\}/F_{ref};\text{ and}$$

$$FER = \mathrm{Mod}\{\{[\mathrm{Mod}(F_{out}, F_{ref})]*CB\}, F_{ref}\};$$

where $F_{out}$ represents the frequency of the output signal, $F_{ref}$ represents the frequency of the reference signal, CB represents the constant multiplication factor, and Mod{ } represents a modulo operation.

7. The frequency synthesizing method of claim 5, wherein the step of providing the first digital value, the second digital value and the third digital value comprises:

determining the first digital value N, the second digital value FE, and the third digital value FER by the following equations:

$$N = F_{out}/F_{ref};$$

$$FE = \{[\mathrm{Mod}(F_{out}, F_{ref})]*CB\}/F_{ref};\text{ and}$$

$$FER = \{\mathrm{Mod}\{\{[\mathrm{Mod}(F_{out}, F_{ref})]*CB\}, F_{ref}\}\}*2^R/F_{ref};$$

where $F_{out}$ represents the frequency of the output signal, $F_{ref}$ represents the frequency of the reference signal, CB represents the constant multiplication factor, R is an integer, and Mod{ } represents a modulo operation.

8. The frequency synthesizing method of claim 5, wherein the step of providing the division factor further comprises:

receiving the third digital value and generating a dithering value according to the received third digital value; and the step of generate the combination result comprises:

combining the dithering value, the second digital value, and the digital feedback value to generate the combination result.

\* \* \* \* \*